(12) United States Patent
Masuda et al.

(10) Patent No.: US 10,892,178 B2
(45) Date of Patent: Jan. 12, 2021

(54) SUBSTRATE PROCESSING SYSTEM, METHOD OF CONTROLLING SUBSTRATE PROCESSING SYSTEM, COMPUTER-READABLE STORAGE MEDIUM, AND METHOD OF MANUFACTURING ARTICLE

(71) Applicant: CANON KABUSHIKI KAISHA, Tokyo (JP)

(72) Inventors: Mitsuhiro Masuda, Utsunomiya (JP); Kenji Yamamoto, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 75 days.

(21) Appl. No.: 16/413,767

(22) Filed: May 16, 2019

(65) Prior Publication Data
US 2019/0371637 A1   Dec. 5, 2019

(30) Foreign Application Priority Data

May 29, 2018 (JP) .................................. 2018-102616
Feb. 27, 2019 (JP) .................................. 2019-034743

(51) Int. Cl.
*H01L 21/67* (2006.01)
*G05B 19/418* (2006.01)

(52) U.S. Cl.
CPC .. *H01L 21/67276* (2013.01); *G05B 19/41875* (2013.01); *G05B 2219/31455* (2013.01);
(Continued)

(58) Field of Classification Search
CPC ........ H01L 21/67276; G05B 19/41875; G05B 2219/31455; G05B 2219/32234
See application file for complete search history.

(56) References Cited

U.S. PATENT DOCUMENTS 6,879,866 B2 * 4/2005 Tel ..................... G05B 23/0283
700/100
2006/0157698 A1 * 7/2006 Miyajima ......... H01L 21/67288
257/48
(Continued)

FOREIGN PATENT DOCUMENTS

JP              2011054804 A       3/2011

*Primary Examiner* — Vincent H Tran
(74) *Attorney, Agent, or Firm* — Rossi, Kimms & McDowell LLP

(57) ABSTRACT

A substrate processing system having a plurality of substrate processing apparatuses, a host control apparatus, and a management apparatus is provided. The management apparatus determines a substrate processing apparatus that needs maintenance processing, based on operation information collected from each of the substrate processing apparatuses, and notifies a determination result to the substrate processing apparatus determined to need the maintenance processing. Each of the substrate processing apparatuses transmits information for executing the maintenance processing to the host control apparatuses upon receiving the determination result. The host control apparatus monitors an operation state of each of the substrate processing apparatuses, and, based on the operation state of the substrate processing apparatus that transmitted the information for executing the maintenance processing, controls a timing of performance of the maintenance processing with respect to the substrate processing apparatus.

23 Claims, 8 Drawing Sheets

(52) U.S. Cl.
CPC .............. *G05B 2219/32234* (2013.01); *G05B 2219/45031* (2013.01)

(56) References Cited

U.S. PATENT DOCUMENTS

2010/0076729 A1* 3/2010 Davis ................. G05B 23/0283
702/184
2011/0245956 A1* 10/2011 Matsushita ...... G05B 19/41875
700/110
2016/0372386 A1* 12/2016 Song ................. H01J 37/32972

* cited by examiner

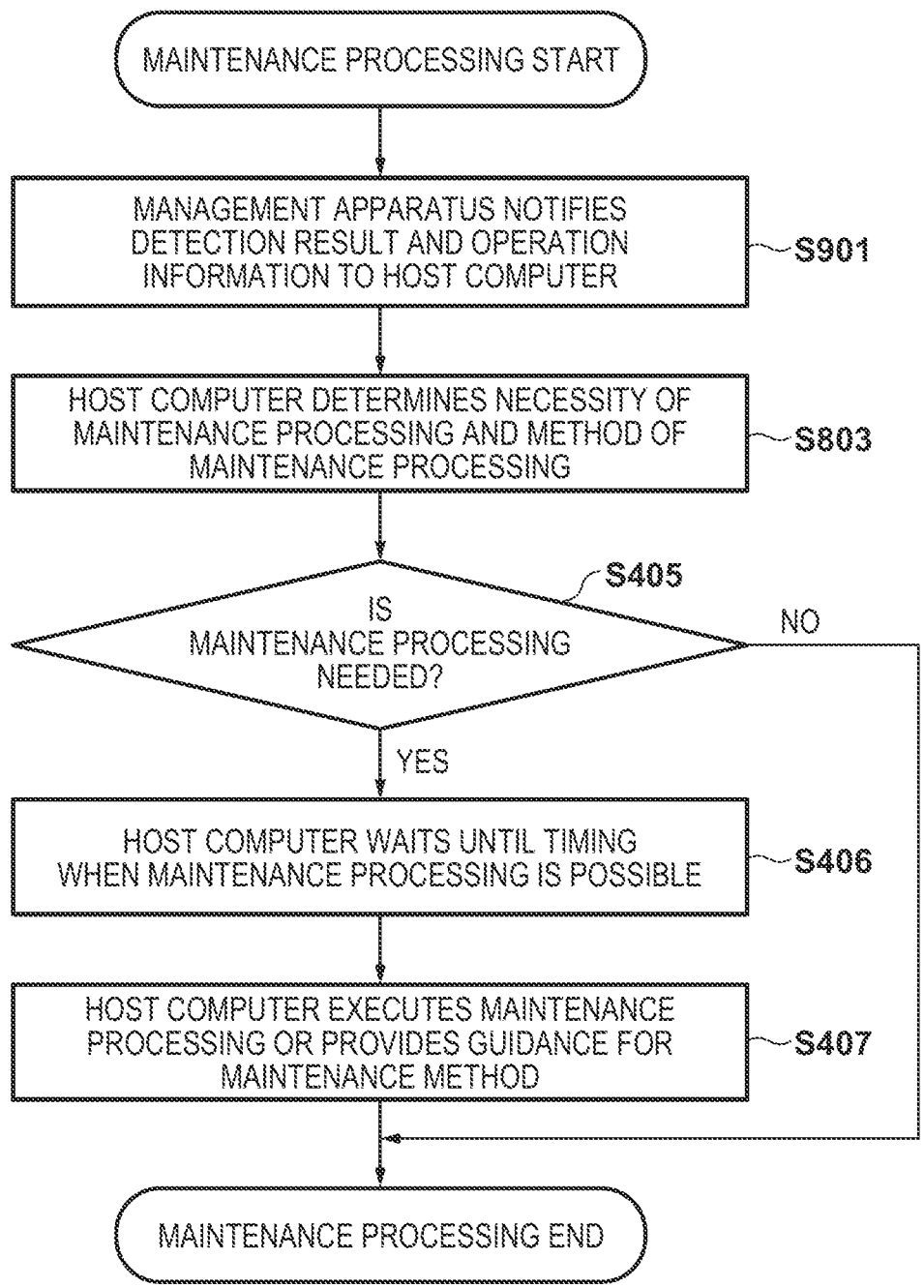

SUBSTRATE PROCESSING SYSTEM, METHOD OF CONTROLLING SUBSTRATE PROCESSING SYSTEM, COMPUTER-READABLE STORAGE MEDIUM, AND METHOD OF MANUFACTURING ARTICLE

BACKGROUND OF THE INVENTION

Field of the Invention

The present invention relates to a substrate processing system, a method of controlling the substrate processing system, a computer-readable storage medium, and a method of manufacturing an article.

Description of the Related Art

A plurality of substrate processing apparatuses are normally installed on a semiconductor manufacturing line, and it is necessary to efficiently perform maintenance of each.

Japanese Patent Laid-Open No. 2011-54804 discloses a method for detecting a problem state of a semiconductor manufacturing apparatus based on data obtained from the semiconductor manufacturing apparatus, and causing a control amount to be reflected in a recipe (processing conditions) for the semiconductor manufacturing apparatus for which the problem state was detected to thereby cause restoration to a normal state.

As a method for restoring an apparatus to a normal state, in addition to causing a control amount to be reflected in a recipe as in Japanese Patent Laid-Open No. 2011-54804, there can be approaches such as causing a characteristic of the apparatus to change. For example, there may be an execution of an apparatus calibration, a reset of the apparatus, a change of a processing sequence, a change of an apparatus parameter, or the like. However, such restoration methods are accompanied by a temporary stop of production. Accordingly, there is a possibility that a scheduled production amount will cease to be achievable if these restoration methods are executed at a time when stoppage of an apparatus is unacceptable with respect to production planning. In addition, when these restoration methods are executed during lot processing, there may be an effect on product quality accompanying processing time variation that accompanies a processing sequence change.

SUMMARY OF THE INVENTION

The present invention provides, for example, a substrate processing system advantageous in maintaining productivity and product quality.

The present invention in its one aspect provides a substrate processing system having a plurality of substrate processing apparatuses operable to process a substrate, a host control apparatus operable to control operation of the plurality of substrate processing apparatuses, and a management apparatus operable to manage maintenance of each of the plurality of substrate processing apparatus, the management apparatus comprising a determination unit configured to determine a substrate processing apparatus that needs maintenance processing, based on operation information collected from each of the plurality of substrate processing apparatuses, and a notification unit configured to notify a determination result to the substrate processing apparatus determined by the determination unit to need the maintenance processing, each of the plurality of substrate processing apparatuses comprising a transmission unit configured to transmit information for executing the maintenance processing to the host control apparatuses upon receiving the determination result, and the host control apparatus comprising a controller configured to monitor an operation state of each of the plurality of substrate processing apparatuses, and, based on the operation state of the substrate processing apparatus that transmitted the information for executing the maintenance processing, control a timing of performance of the maintenance processing with respect to the substrate processing apparatus.

Further features of the present invention will become apparent from the following description of exemplary embodiments (with reference to the attached drawings).

BRIEF DESCRIPTION OF THE DRAWINGS

FIG. 9 is a flowchart illustrating a method for maintenance processing in the substrate processing system of the fourth embodiment.

DESCRIPTION OF THE EMBODIMENTS

Figure 1:
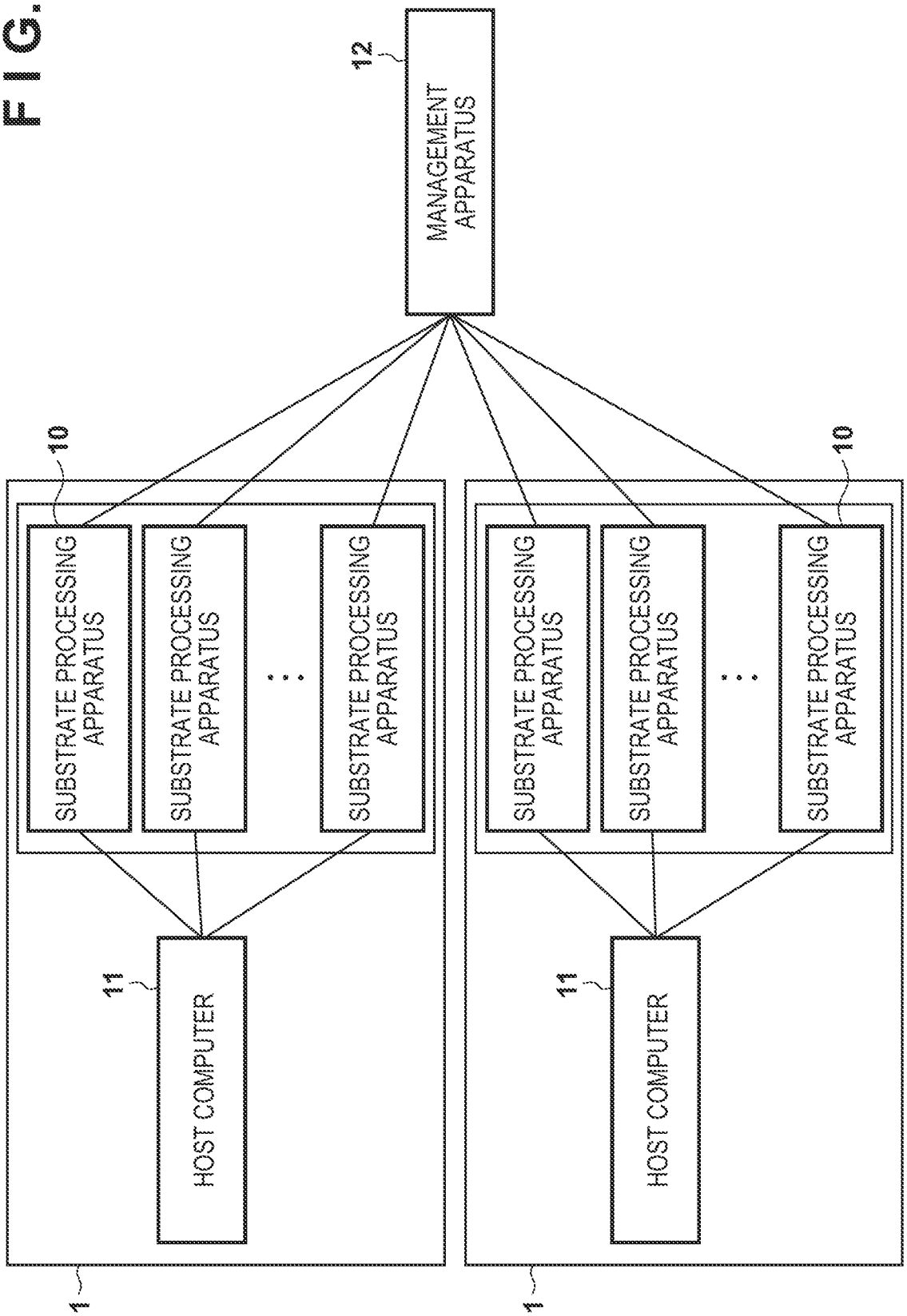
FIG. 1 is a view illustrating a configuration of a substrate processing system in a first embodiment.

Various exemplary embodiments, features, and aspects of the invention will be described in detail below with reference to the drawings.

Hereinafter, embodiments will be described in detail with reference to the attached drawings. Note, the following embodiments are not intended to limit the invention according to the scope of the claims. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

First Embodiment

FIG. 1 is a block diagram illustrating a configuration of a substrate processing system in the present embodiment. A semiconductor manufacturing line 1 may respectively include a plurality of substrate processing apparatuses 10 (semiconductor manufacturing apparatuses) for processing substrates, and a host computer 11 (a host control apparatus) for controlling operation of the plurality of substrate processing apparatuses 10. Each of the plurality of substrate processing apparatuses 10 may be one of a lithography apparatus (such as an exposure apparatus, an imprint apparatus, or a charged-particle beam drawing apparatus), a deposition apparatus (such as a CVD apparatus), a machining apparatus (such as a laser machining apparatus), or an inspection apparatus (such as an overlay inspection apparatus). In addition, the plurality of substrate processing apparatuses may also include a coater/developer for performing a process for coating a resist material (an adhesion material) onto a substrate as preprocessing for lithography processing, and performing development processing as post processing for lithography processing. Note that an exposure apparatus exposes, via an original (a mask), photoresist supplied onto a substrate to thereby form a latent image corresponding to a pattern of the original on the photoresist. An imprint apparatus forms a pattern on a substrate by curing an imprint material in a state in which a mold (an original) is brought into contact with the imprint material which is supplied onto the substrate. The charged-particle beam drawing apparatus draws a pattern in accordance with a charged particle beam on the photoresist supplied onto the substrate to thereby form a latent image on the photoresist.

Each of the plurality of substrate processing apparatuses 10 in the semiconductor manufacturing line 1 is connected to a management apparatus 12 for managing maintenance. As illustrated by FIG. 1, the substrate processing system can include a plurality of semiconductor manufacturing lines 1. Therefore, the management apparatus 12 can manage each substrate processing apparatus in a plurality of semiconductor manufacturing lines. The management apparatus 12 may function as a maintenance determination apparatus for collecting and analyzing operation information for each of the plurality of substrate processing apparatuses 10, and, for each substrate processing apparatus, detecting an abnormality or a sign thereof, and determining the necessity of maintenance processing. In FIG. 1, connections between a plurality of substrate processing apparatuses and the host computer 11, and connections between the plurality of substrate processing apparatuses and the management apparatus 12 may be wired or wireless connections.

Figure 2:
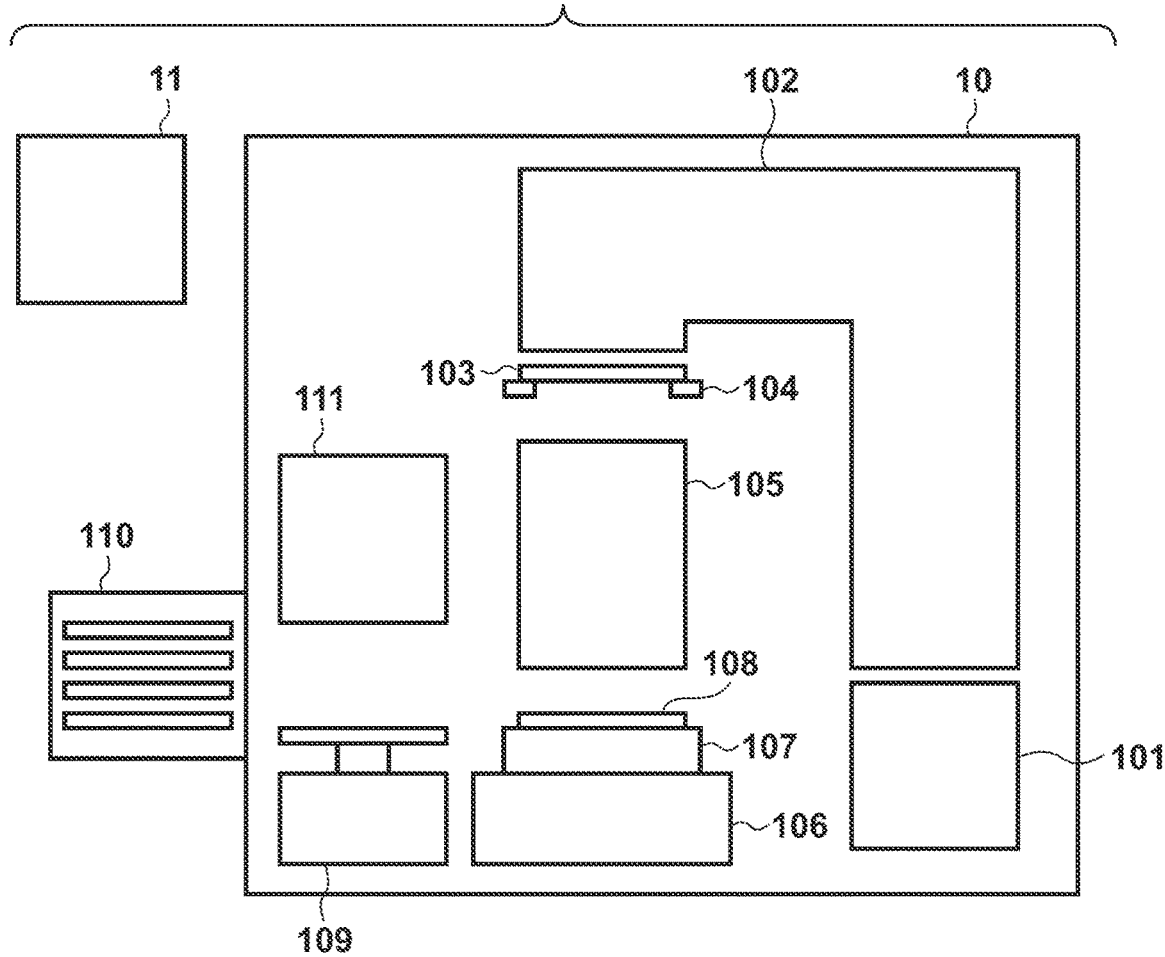
FIG. 2 is a view illustrating a configuration of an exposure apparatus in a first embodiment.

To provide a concrete example, description is given below regarding an example in which each of the plurality of substrate processing apparatuses 10 is configured as an exposure apparatus. FIG. 2 illustrates a configuration of an exposure apparatus which is a substrate processing apparatus 10. The exposure apparatus has a light source unit 101. A high pressure mercury lamp, an excimer laser, or the like can be used as a light source, for example. If the light source is an excimer laser, the light source unit 101 is not limited to being inside a chamber of the exposure apparatus, and it may be configured to be externally attached.

Light that has left the light source unit 101 goes through an illumination system 102 to illuminate a mask 103 which is an original held on a mask stage 104. Note that the mask 103 may also be referred to as a reticle. A circuit pattern to be transferred is drawn onto the mask 103. Light that illuminates the mask 103 reaches a substrate 108 through a projection optical system 105. Note that a silicon wafer or the like is used as the substrate 108, for example.

The pattern on the mask 103 is, via the projection optical system 105, transferred to a photosensitive medium (for example, a resist), coated onto the substrate 108. The substrate 108 is held in a state of having been corrected to be flat on a substrate chuck 107 in accordance with vacuum adsorption or the like. In addition, the substrate chuck 107 is held by a substrate stage 106. The substrate stage 106 is configured to be moveable. The exposure apparatus repeatedly exposes a plurality of shot regions on the substrate 108, while performing stepped movements two-dimensionally of the substrate stage 106 in a plane orthogonal to the optical axis of the projection optical system 105. This is an exposure method referred to as a step-and-repeat method. Note that an exposure method referred to as a step-and-scan method for scanning and performing exposure while synchronizing the mask stage 104 and the substrate stage 106 may be employed.

In the exposure apparatus illustrated in FIG. 2, a substrate 108 before an exposure process is set, in the exposure apparatus, in a state of being stored in a substrate cassette 110. At least one and normally a plurality of substrates 108 are stored inside the substrate cassette 110. By a robot hand (not shown) or the like, one substrate 108 is removed from the substrate cassette 110 and placed in a pre-alignment unit 109. After azimuth angle alignment and positional alignment are performed for the substrate 108 by the pre-alignment unit 109, the substrate 108 is set on the substrate chuck 107 by the robot hand, and subsequently an exposure process is performed. The substrate 108, after finishing the exposure process, is removed from the top of the substrate chuck 107 and retrieved to the substrate cassette 110 by the robot hand, and a subsequent substrate 108 waiting on the pre-alignment unit 109 is set onto the substrate chuck 107. In this way, the substrates 108 are subject to an exposure process one after another. Note that configuration may be taken such that the exposure apparatus is connected inline to another apparatus such as a coating/developing apparatus, a substrate 108 before an exposure process is conveyed from the other apparatus, and a substrate 108 after an exposure process is discharged to the other apparatus.

In addition, the exposure apparatus has a controller 111. The controller 111 is configured by an information processing apparatus such as a computer, and performs various calculations and control of each unit of the exposure apparatus. In the example of FIG. 1 there is one controller 111, but there is no limitation to one controller 111, and there may be a configuration where a plurality of controllers 111 control each unit.

Figure 3:
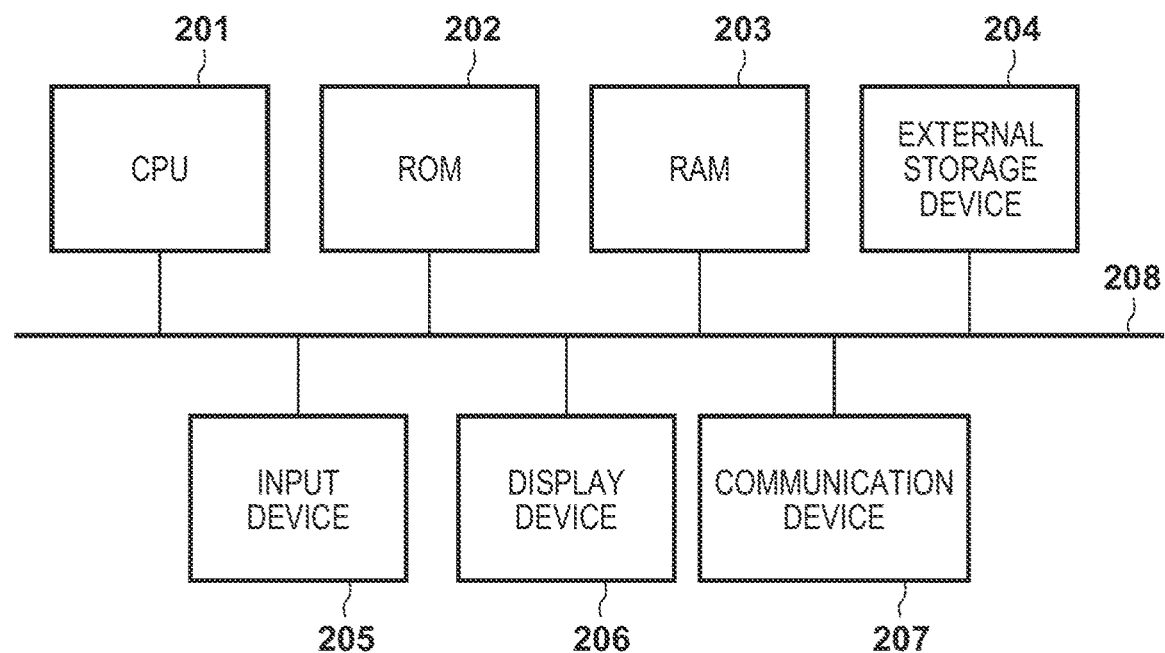
FIG. 3 is a view illustrating a configuration of a host computer in a first embodiment.

FIG. 3 is a block diagram that illustrates a configuration of the host computer 11. The host computer 11 is arranged outside of the exposure apparatus, and is an information processing apparatus that controls a plurality of substrate processing apparatuses that are not limited to being exposure apparatuses. A CPU 201 executes an OS (Operating System) and various application programs. A ROM 202 stores a program executed by the CPU 201, and fixed data from among parameters for calculations. A RAM 203 provides a work region for the CPU 201, and a temporary storage region for data. The ROM 202 and the RAM 203 are connected to the CPU 201 via a bus 208. An input device 205 may include a mouse, a keyboard, or the like, and a display device 206 may include a CRT or a liquid crystal display. An external storage device 204 may include a hard disk, a CD, a DVD, or a memory card, and stores various programs including a control program for the exposure process, history data (a log) of an exposure process, or the like. The input device 205, the display device 206, and the external storage device 204 are each connected to the bus 208 via an interface (not shown). In addition, a communication device 207 for connecting to a network to perform communication is also connected to the bus 208. The communication device 207 is connected to a LAN, for example, performs data communication in accordance with a communication protocol such as TCP/IP, and is used in a case of mutually performing communication with another communication device. The communication device 207 functions as a transmission unit and a reception unit for data, and, for example, receives operation information from another control process or the controller 111 inside the exposure apparatus, and records this operation information in a log stored in the external storage apparatus 204. In addition, the communication device 207 may successively transmit received operation information to the management apparatus 12, and may transmit a log stored in the external storage device 204 based on a request from the management apparatus 12.

Description has thus been given for the overview configuration of the host computer 11 with reference to FIG. 3, but the management apparatus 12 and the controller 111 inside the exposure apparatus may be provided with a configuration that is similar to this.

The management apparatus 12 can function as a determination unit for determining a substrate processing apparatus that needs maintenance processing, based on operation information collected from each of the plurality of substrate processing apparatuses 10. For example, the management apparatus 12 collects and analyzes operation information from each of the plurality of substrate processing apparatuses 10, detects what kind of abnormality or sign thereof is occurring for which substrate processing apparatus, and determines the necessity of maintenance processing and a method for maintenance processing. The maintenance processing can include at least one of an execution of an apparatus calibration, a reset of the apparatus, a change of a processing sequence, a change of an apparatus parameter, or the like, for example.

For example, accompanying variation of an exposure dose, a temperature distribution of the projection optical system 105 changes, and optical characteristics such as a focus position also change (aberration induced by exposure). This characteristic can be corrected by the substrate processing apparatuses 10 in open loop control based on the exposure dose. In addition, control error can be corrected by periodically actually measuring the optical characteristics of the projection optical system 105, and performing feedback. The management apparatus 12, for example, obtains a result of this actual measurement as operation information, and determines that maintenance processing is needed if an amount of correction calculated from the actual measurement result is greater than a predetermined threshold value. In this way, the management apparatus 12 collects and analyzes operation information to determine that maintenance processing is needed if the amount of correction is greater than a threshold value. In addition, upon determining that maintenance processing is needed, the management apparatus 12 may perform an actual measurement of the optical characteristics of the projection optical system 105 again, and determine, as the maintenance processing, that it is necessary to update a coefficient used in open loop control of the projection optical system 105. In addition, the management apparatus 12 may determine, as the maintenance processing, that it is necessary to increase a frequency of the actual measurement of the characteristics of the projection optical system 105 in comparison to a case where the amount of correction is not larger than the threshold value.

The management apparatus 12 can function as a notification unit for notifying a determination result to a substrate processing apparatus determined by the management apparatus 12 to need maintenance processing. In response to receiving a determination result from the management apparatus 12, the substrate processing apparatus notifies information for executing maintenance processing based on the determination result to the host computer 11. The host computer 11 monitors the operation state of each of a plurality of substrate processing apparatuses, and, based on received information and the operation states, instructs a relevant substrate processing apparatus or another related substrate processing apparatus to execute maintenance processing, or provides guidance for a maintenance method to an operator.

Figure 4:
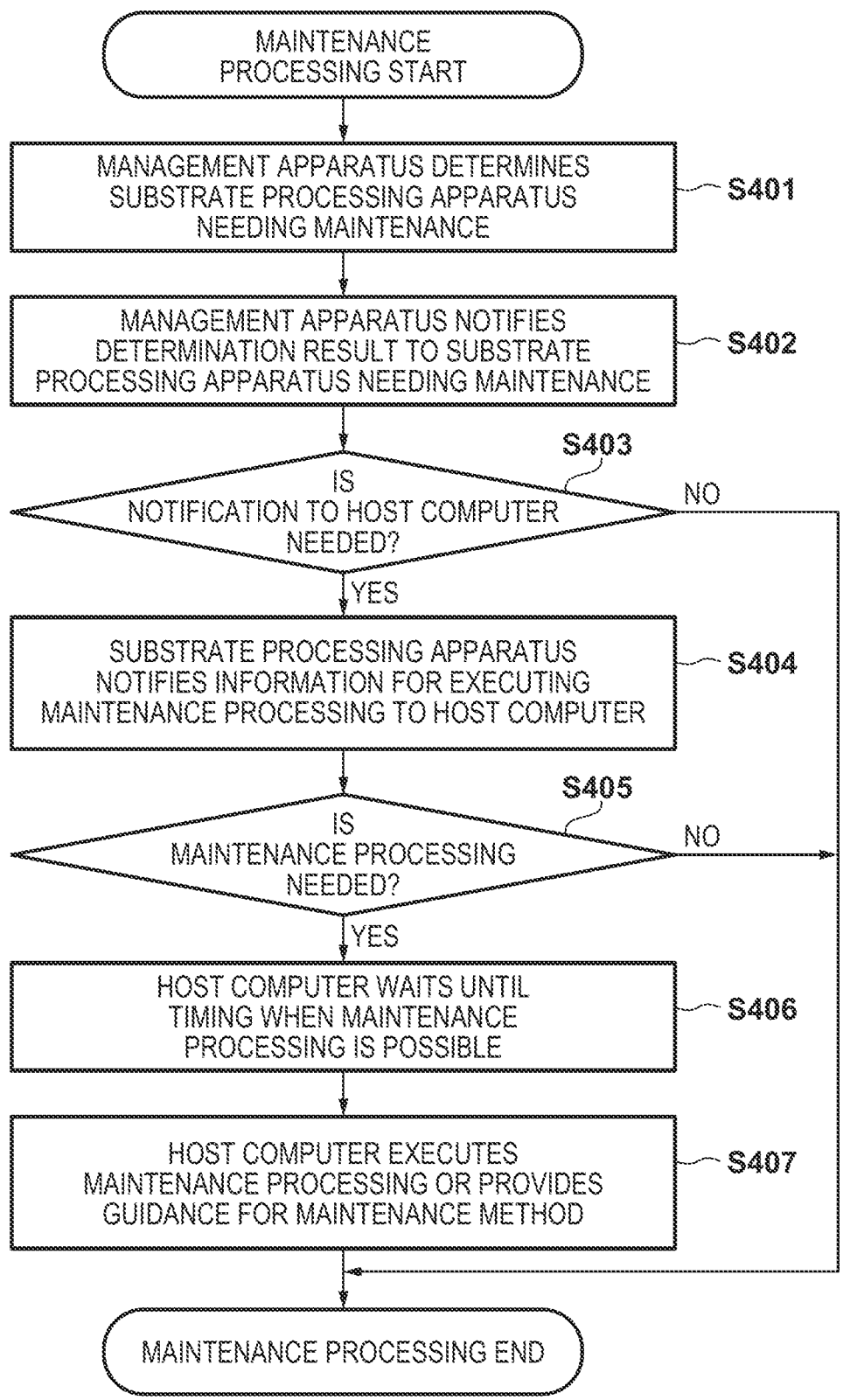
FIG. 4 is a flowchart illustrating a method for maintenance processing in the substrate processing system of the first embodiment.

FIG. 4 is a flowchart illustrating a method for maintenance processing in the substrate processing system of the present embodiment. In step S401, the management apparatus 12 determines a substrate processing apparatus that needs maintenance processing, based on operation information collected from each of the plurality of substrate processing apparatuses 10. In step S402, the management apparatus 12 notifies a determination result to a substrate processing apparatus determined by the management apparatus 12 to need maintenance processing. This determination result can include a determination reason, a data name and value that are the grounds of the determination, and a maintenance method.

In step S403, (the controller 111 of) a substrate processing apparatus that received a determination result determines whether it is necessary to notify the host computer 11 of information for executing maintenance processing. For example, if a corresponding substrate processing apparatus is undergoing maintenance and therefore a predetermined measurement value is temporarily an irregular value, and a determination grounds value being too large or too small is notified to the substrate processing apparatus, transmission to the host computer 11 of information for executing maintenance processing may be suspended. In addition, if a corresponding substrate processing apparatus is already manually or automatically undergoing maintenance processing at a timing when a determination result is notified, transmission of information to the host computer 11 may be suspended.

If the substrate processing apparatus determines that notification to the host computer 11 is necessary, in step S404, the substrate processing apparatus notifies information for executing maintenance processing to the host computer 11. This information is based on the notified determination result. For example, this information may be in the form of the determination result as it is received from the management apparatus 12, or modifications may be applied thereto. For example, there may be a case in which an apparatus parameter to be corrected is included in a determination result, and in which an identifier of an apparatus parameter which is only used inside of a substrate processing apparatus is included as an identifier of the apparatus parameter. Because such an identifier is not correctly recognized by the host computer 11, (the controller 111 of) the substrate processing apparatus may convert the identifier to an identifier that can be recognized by the host computer 11, and make a notification by including the determination result after the conversion in information for executing the maintenance processing.

In addition, if units of data used by the host computer 11 and the substrate processing apparatus differ, it may be necessary to perform a calculation on the data to convert the units. If such data is included in a determination result, the substrate processing apparatus may perform a calculation to convert a unit of data to a unit used by the host computer 11, and make a notification by including a determination result after the calculation in the information for executing the maintenance processing. In addition, if it is necessary to make a conversion to a different unit in accordance with an apparatus parameter, the substrate processing apparatus may change a calculation method for data in accordance with an apparatus parameter.

The management apparatus 12 may transmit a common determination result to two or more substrate processing apparatuses out of the plurality of substrate processing apparatuses. In such a case, an item that is unnecessary, to a substrate processing apparatus that received the determination result, for a determination of the necessity of the maintenance processing to be performed in the subsequent step S405 may be included in the determination result. In such a case, the substrate processing apparatus may make the notification after removing such an item from the received determination result, and including this in the information for executing the maintenance processing.

In addition, the determination result and information of a current apparatus state may be notified to the host computer 11 by including them in the information for executing the maintenance processing. For example, the information of apparatus state may include current processing sequence information of the apparatus, and environment information of the apparatus, for example, information such as a temperature or an atmosphere inside a chamber, a number of times the substrate stage 106 has been driven, a voltage value and a current value for driving, and a vacuum pressure of the substrate chuck 107.

In step S405, the host computer 11 determines whether the maintenance processing is necessary, based on the received information for executing the maintenance processing. For example, it is assumed that information of an overlay error, which is predicted for a case where the maintenance processing is not executed, is included in the information for executing the maintenance processing. Configuration may be taken to determine that it is not necessary to perform the maintenance processing if it is determined, with a substrate which is scheduled to be processed in the substrate processing apparatus, that there is a large budget and that an overlay error will not be a problem.

If it is determined that the maintenance processing is necessary, in step S406, the host computer 11 puts the maintenance processing on standby until a timing when the maintenance processing is possible is reached. For example, the host computer 11 may wait until a production status such that stopping the substrate processing apparatus, which accompanies the maintenance processing, can be allowed is reached. Alternatively, configuration may be taken such that, at a timing when the information for executing the maintenance processing is notified, the host computer 11 does not queue a new lot for the substrate processing apparatus and waits until processing ends for all lots that are already present. In this way, based on the operation state of a substrate processing apparatus that transmitted information for executing maintenance processing, the host computer 11 controls a timing for the performance of the maintenance processing with respect to the substrate processing apparatus.

Subsequently, in step S407, the host computer 11 executes the maintenance processing, or provides guidance for a maintenance method to an operator. It is envisioned that the maintenance processing is performed on the substrate processing apparatus, but it may be performed on another related substrate processing apparatus. In addition, the substrate processing apparatus may be controlled to rework substrates for times at and after when the host computer 11 determined that the maintenance processing was necessary.

By virtue of the embodiment described above, a timing for the performance of maintenance processing with respect to a substrate processing apparatus is adjusted based on an operation state of the substrate processing apparatus. By this, it is possible to avoid ceasing to be able to achieve a scheduled production amount by maintenance processing being executed despite being in a time where an apparatus stoppage is not acceptable with respect to production planning, for example. In addition, because it is possible to execute maintenance processing after waiting for lot processing to finish, for example, it is possible to minimize the effect on product quality.

Second Embodiment

Figure 5:
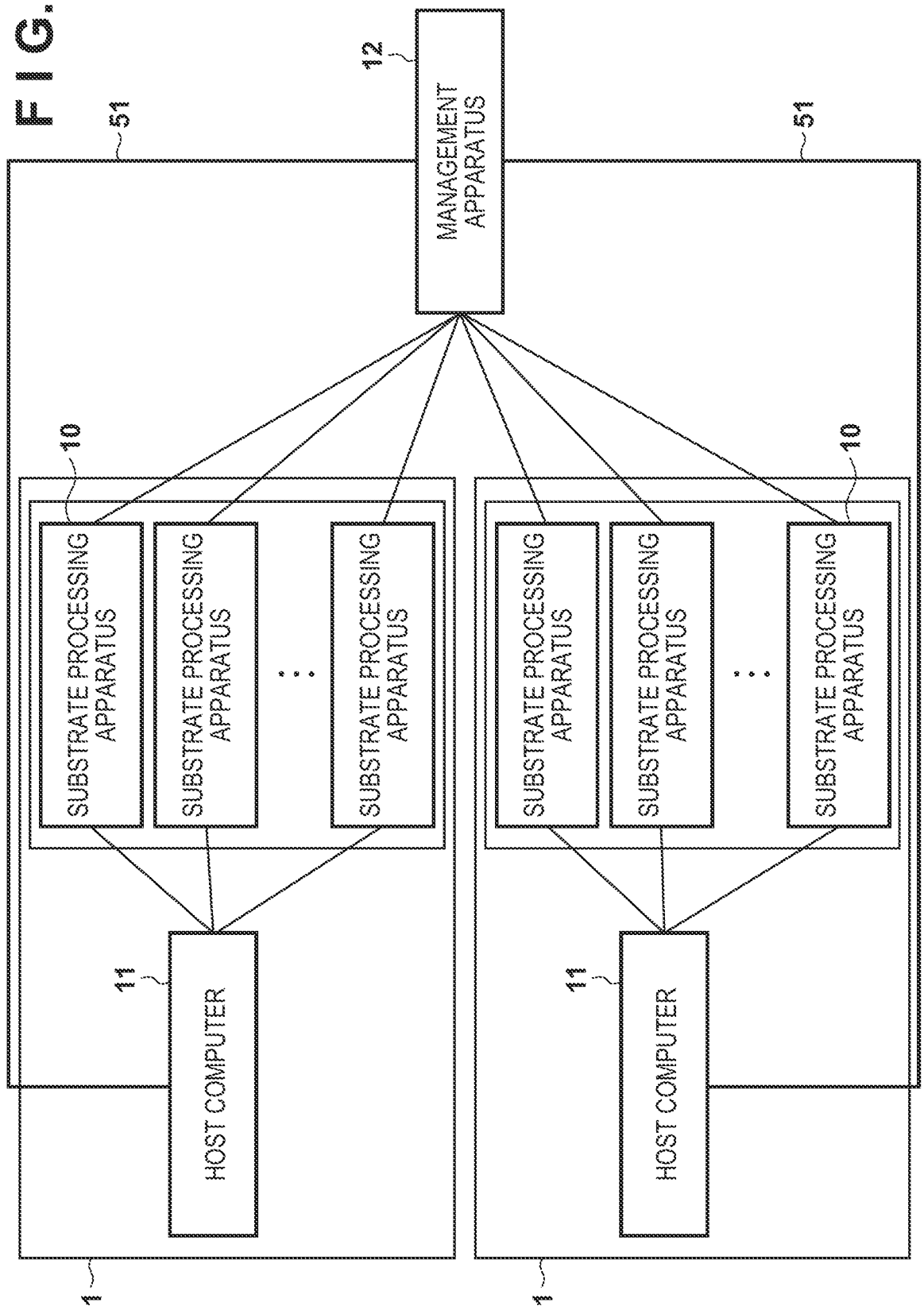
FIG. 5 is a view illustrating a configuration of a substrate processing system in a second embodiment.

FIG. 5 is a block diagram illustrating a configuration of a substrate processing system in a second embodiment. The same reference signs are added to configuration blocks that are the same as those in FIG. 1, and description thereof is omitted. Transfer of data from the management apparatus 12 to a host computer 11 is performed via substrate processing apparatuses 10 in FIG. 1, but, in FIG. 5, the transfer is performed via a communication path 51 which directly connects the management apparatus 12 and a host computer 11. In the present embodiment, the management apparatus 12 notifies information for executing maintenance processing to the host computer 11 via the communication path 51.

Figure 6:
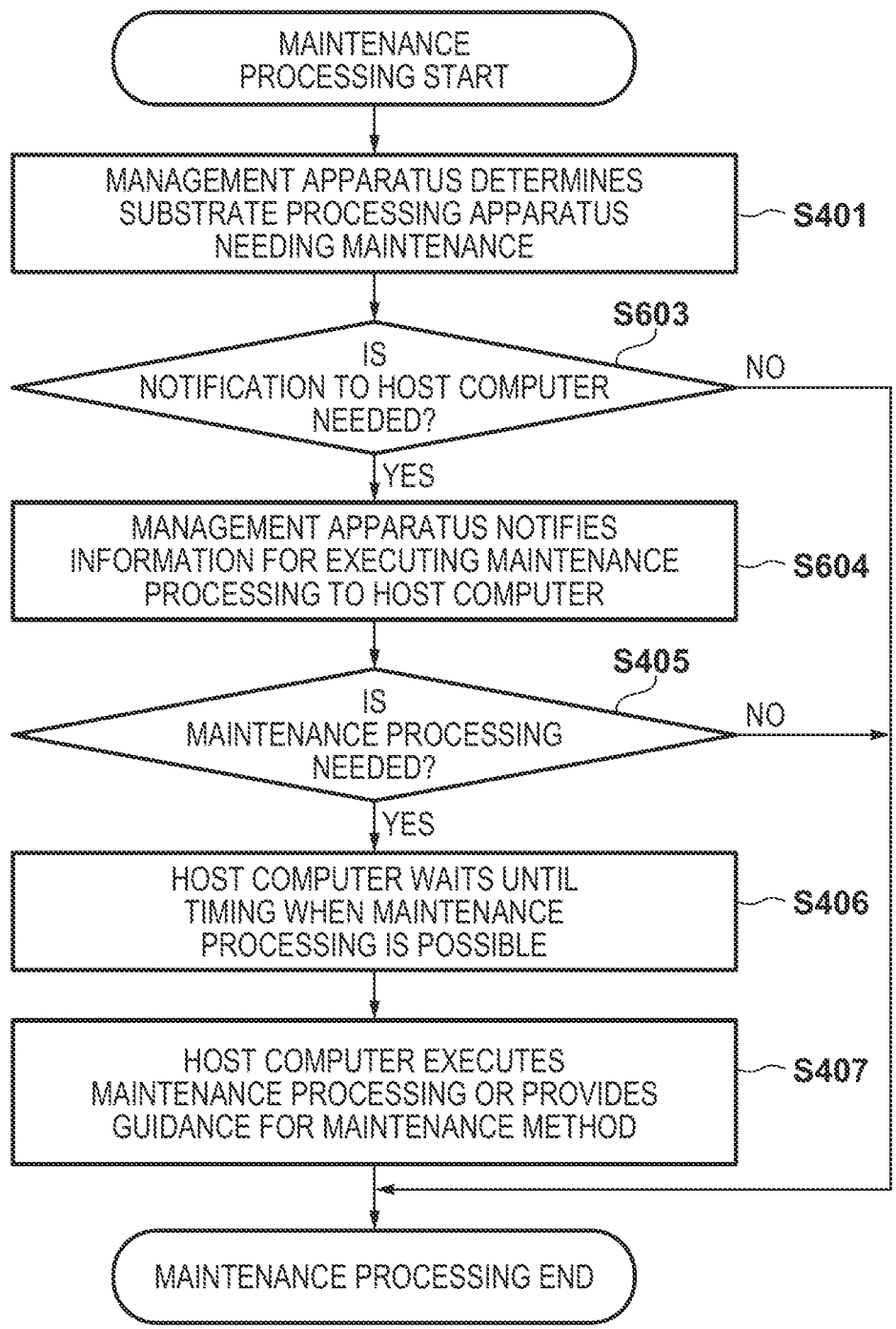
FIG. 6 is a flowchart illustrating a method for maintenance processing in the substrate processing system of the second embodiment.

FIG. 6 is a flowchart illustrating a method for maintenance processing in the substrate processing system of the present embodiment. The same reference signs are added to the same process steps as those in the flowchart of FIG. 4, and description thereof is omitted. In the first embodiment, in step S403, a substrate processing apparatus that received a determination result determines whether it is necessary to notify the host computer 11 of information for executing maintenance processing. In contrast to this, in the present embodiment, after step S401, in step S603, the management apparatus 12 determines whether it is necessary to notify information for executing the maintenance processing to the host computer 11. For example, based on operation information collected from a substrate processing apparatus for which it is determined that maintenance processing is necessary, it is determined whether the substrate processing apparatus is undergoing maintenance. If it is undergoing maintenance, a predetermined measurement value will temporarily be an irregular value, and a determination grounds value will be too large or too small. In such a case, notification to the host computer 11 of information for executing maintenance processing is suspended.

If it is determined that notification to the host computer 11 is necessary, in step S604, the management apparatus 12 notifies the information for executing the maintenance processing to the host computer 11 via the communication path 51. In such a case, based on operation information collected from the corresponding substrate processing apparatus, for example, the management apparatus 12 may make a notification to the host computer 11 by including information of a current apparatus state in the information for executing the maintenance processing. Subsequent processing is similar to that in the first embodiment (step S405 to step S407).

Third Embodiment

In the first embodiment and the second embodiment described above, the host computer 11 executes maintenance processing, but, in the third embodiment, configuration is such that the management apparatus 12 executes maintenance processing, instead of the host computer 11. The configuration of the substrate processing system in the present embodiment is similar to FIG. 5 for the second embodiment. Accordingly, in the present embodiment, the host computer 11 transmits a request for maintenance processing to the management apparatus 12 via the communication path 51. Upon receiving the request for maintenance processing from the host computer 11, the management apparatus 12 executes maintenance processing with respect to a target substrate processing apparatus that is included in the request, or another related substrate processing apparatus.

Figure 7:
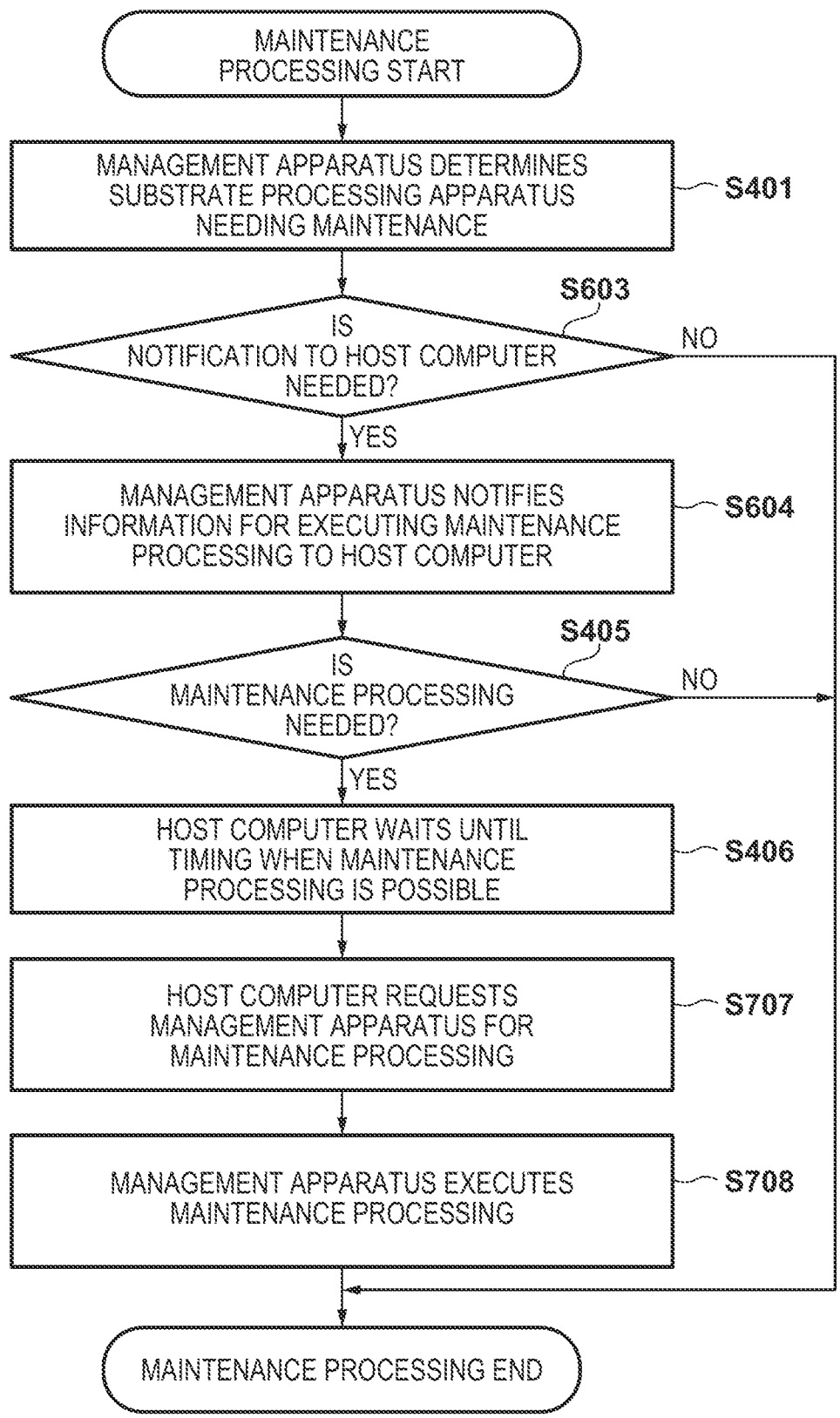
FIG. 7 is a flowchart illustrating a method for maintenance processing in a substrate processing system of a third embodiment.

FIG. 7 is a flowchart illustrating a method for maintenance processing in the substrate processing system of the present embodiment. The same reference signs are added to the same process steps as those in the flowcharts of FIG. 4 and FIG. 6, and description thereof is omitted.

In FIG. 7, up until step S406 is the same as in FIG. 6. In FIG. 6, maintenance processing is executed on the host computer 11 in step S407. In contrast to this, In FIG. 7, maintenance processing is executed on the management apparatus 12 in accordance with step S707 and step S708. Specifically, in step S707, the host computer 11 transmits a request message for maintenance processing to the management apparatus 12, via the communication path 51. In step S708, the management apparatus 12 executes maintenance processing in accordance with the received request message.

Fourth Embodiment

In the fourth embodiment, the host computer 11 determines the necessity of maintenance processing and a method of maintenance processing, instead of the management apparatus 12. When the configuration of a substrate processing system is the configuration of FIG. 1 for the first embodiment, the management apparatus 12 functions as a detection unit that analyzes operation information collected from each of the plurality of substrate processing apparatuses 10, and detects in which substrate processing apparatus an abnormality or a sign thereof is occurring. The management apparatus 12 notifies a detection result and operation information to the substrate processing apparatus 10 where the occurrence of an abnormality or a sign thereof was detected. Each of the plurality of substrate processing apparatuses 10 has a transmission unit for, in a case of having received a detection result and operation information, transmitting the detection result and the operation information to the host computer 11. The substrate processing apparatus 10 that received the detection result and the operation information transmits (transfers) the detection result and the operation information to the host computer 11 in accordance with the transmission unit.

In addition, if the configuration of a substrate processing system is the configuration of FIG. 5 for the second embodiment, the management apparatus 12 notifies the detection result and the operation information to the host computer 11 without going through the substrate processing apparatuses 10.

Based on the received detection result and operation information, the host computer 11 determines the necessity of maintenance processing, and a method for maintenance processing.

Figure 8:
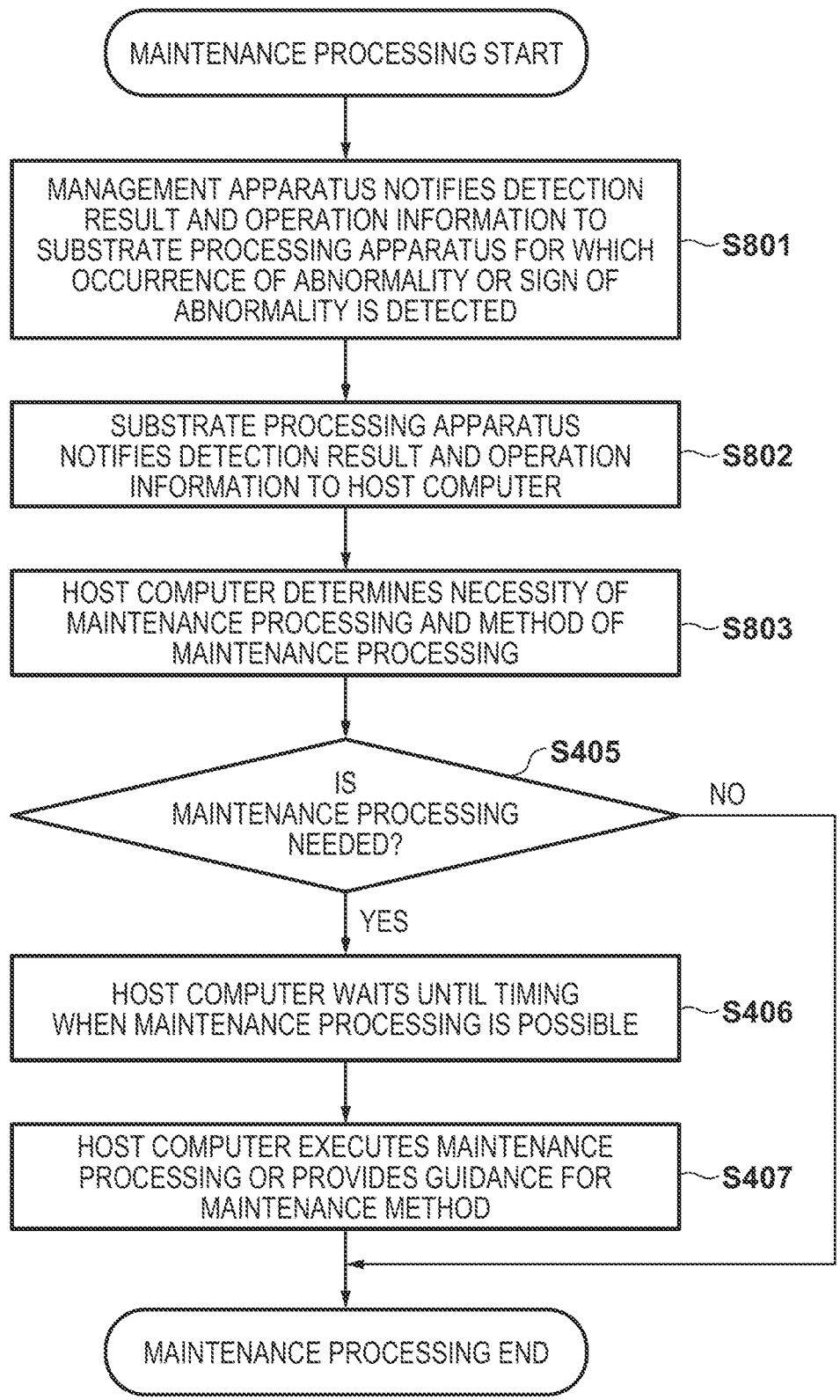
FIG. 8 is a flowchart illustrating a method for maintenance processing in a substrate processing system of a fourth embodiment.

FIG. 8 and FIG. 9 are flowcharts illustrating a method for maintenance processing in the substrate processing system of the present embodiment. The same reference signs are added to the same process steps as those in the flowcharts of FIG. 4 and FIG. 6, and description thereof is omitted.

Firstly, description is given regarding the flowchart of FIG. 8. Here, it is assumed that a substrate processing system has the configuration of FIG. 1. In step S801, the management apparatus 12 analyzes the operation information collected from each of the plurality of substrate processing apparatuses 10, and detects in which substrate processing apparatus an abnormality or a sign thereof is occurring. The management apparatus 12 notifies a detection result and operation information to the substrate processing apparatus 10 where the occurrence of an abnormality or a sign thereof was detected.

In step S802, the substrate processing apparatus 10 notifies (transfers) the received detection result and operation information to the host computer 11. In step S803, based on the received detection result and operation information, the host computer 11 determines the necessity of maintenance processing and a method of maintenance processing for a first substrate processing apparatus which is the substrate processing apparatus that transmitted the detection result and the operation information. Subsequent processing is similar to in the first embodiment, and the host computer 11 controls, based on the operation state of the first substrate processing apparatus, a timing for performance of maintenance processing with respect to the first substrate processing apparatus (step S405 to step S407).

Next, description is given regarding the flowchart of FIG. 9. Here, it is assumed that a substrate processing system has the configuration of FIG. 5. In step S901, the management apparatus 12 analyzes the operation information collected from each of the plurality of substrate processing apparatuses 10, and detects in which substrate processing apparatus an abnormality or a sign thereof is occurring. The management apparatus 12 then notifies the detection result and the operation information to the host computer 11. Here the detection result includes identification information of a substrate processing apparatus for which the occurrence of an abnormality or a sign thereof has been detected. In step S803, from the identification information included in the received detection result, the host computer 11 identifies the substrate processing apparatus (a first substrate processing apparatus) for which the occurrence of an abnormality or a sign thereof was detected. Based on the received detection result and operation information, the host computer 11 determines the necessity of maintenance processing with respect to the first substrate processing apparatus, and a method for the maintenance processing. Subsequent processing is similar to in the first embodiment, and the host computer 11 controls, based on the operation state of the first substrate processing apparatus, a timing for performance of maintenance processing with respect to the first substrate processing apparatus (step S405 to step S407).

<Embodiment of Method of Manufacturing Article>

A method of manufacturing an article according to an embodiment of the present invention is suitable to manufacturing an article such as an element having a microstructure or micro-device such as a semiconductor device, for example. The method of manufacturing an article of the present embodiment can include a forming step for using the foregoing substrate processing system to form a pattern of an original onto a substrate, and a machining step for machining the substrate onto which the pattern was formed in the forming step. Furthermore, the corresponding article manufacturing method includes other well-known steps (such as oxidation, film formation, vapor deposition, doping, planarization, etching, resist stripping, dicing, bonding, and packaging). The method of manufacturing an article of the present embodiment is advantageous in at least one of capability, quality, productivity, and manufacturing cost of the article in comparison to a conventional method.

OTHER EMBODIMENTS

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2018-102616, filed May 29, 2018, and No. 2019-034743, filed Feb. 27, 2019, which are hereby incorporated by reference herein in their entirety.

What is claimed is:

1. A substrate processing system having a plurality of substrate processing apparatuses operable to process a substrate, a host control apparatus operable to control operation of the plurality of substrate processing apparatuses, and a management apparatus operable to manage maintenance of each of the plurality of substrate processing apparatus,
    the management apparatus comprising:
    a determination unit configured to determine a substrate processing apparatus that needs maintenance processing, based on operation information collected from each of the plurality of substrate processing apparatuses; and
    a notification unit configured to notify a determination result to the substrate processing apparatus determined by the determination unit to need the maintenance processing,
    each of the plurality of substrate processing apparatuses comprising
    a transmission unit configured to transmit information for executing the maintenance processing to the host control apparatuses upon receiving the determination result, and
    the host control apparatus comprising
    a controller configured to monitor an operation state of each of the plurality of substrate processing apparatuses, and, based on the operation state of the substrate processing apparatus that transmitted the information for executing the maintenance processing, control a timing of performance of the maintenance processing with respect to the substrate processing apparatus.

2. The substrate processing system according to claim 1, wherein the maintenance processing includes at least one of an execution of an apparatus calibration, an apparatus reset, a change of a processing sequence, and a change of an apparatus parameter.

3. The substrate processing system according to claim 2, wherein
    the plurality of substrate processing apparatuses includes an exposure apparatus configured to expose a substrate, and
    the determination unit, based on a result of a measurement of an optical characteristic of an optical system in the exposure apparatus that is obtained from the exposure apparatus as the operation information, calculates an amount of correction for the optical system, and determines that the maintenance processing is needed with respect to the exposure apparatus if the amount of correction is greater than a predetermined threshold value.

4. The substrate processing system according to claim 3, wherein the maintenance processing includes updating a coefficient used in open loop control of the optical system, as the change of the apparatus parameter.

5. The substrate processing system according to claim 3, wherein the maintenance processing includes increasing a frequency of measurement of the optical characteristic in comparison to a case where the amount of correction is not greater than the threshold value.

6. The substrate processing system according to claim 1, wherein, in accordance with the operation state of the substrate processing apparatus determined to need the maintenance processing, the transmission unit suspends transmission to the host control apparatus of the information for executing the maintenance processing.

7. The substrate processing system according to claim 6, wherein, if there is a state where the maintenance processing is being executed in the substrate processing apparatus determined to need the maintenance processing, the transmission unit suspends transmission to the host control apparatus of the information for executing the maintenance processing.

8. The substrate processing system according to claim 1, wherein each of the plurality of substrate processing apparatuses, upon receiving the determination result, converts information included in the determination result to information that enables identification by the host control apparatus, and, by the transmission unit, transmits to the host control apparatus by including the determination result after the conversion in the information for executing the maintenance processing.

9. The substrate processing system according to claim 8, wherein the information included in the determination result includes an identifier of an apparatus parameter of the plurality of substrate processing apparatuses.

10. The substrate processing system according to claim 1, wherein each of the plurality of substrate processing apparatuses, upon receiving the determination result, converts data included in the determination result in accordance with a calculation, and, by the transmission unit, transmits to the host control apparatus by including the determination result after the conversion in the information for executing the maintenance processing.

11. The substrate processing system according to claim 10, wherein the calculation includes a calculation for converting a unit for the data to a unit used by the host control apparatus.

12. The substrate processing system according to claim 1, wherein each of the plurality of substrate processing apparatuses, upon receiving the determination result, transmits, by the transmission unit, to the host control apparatus by including the determination result and information of an apparatus state of the substrate processing apparatus in the information for executing the maintenance processing.

13. A method of manufacturing an article from a substrate, the method comprising:
   forming a pattern on the substrate using a substrate processing system according to claim 1; and
   processing the substrate on which the pattern has been formed,
   wherein the article is manufactured from the processed substrate.

14. A substrate processing system having a plurality of substrate processing apparatuses operable to process a substrate, a host control apparatus operable to control operation of the plurality of substrate processing apparatuses, and a management apparatus operable to manage maintenance of each of the plurality of substrate processing apparatus,
   the management apparatus comprising:
   a determination unit configured to determine a substrate processing apparatus that needs maintenance processing, based on operation information collected from each of the plurality of substrate processing apparatuses; and
   a notification unit configured to notify, to the host control apparatus, information for executing the maintenance processing with respect to the substrate processing apparatus determined by the determination unit to need the maintenance processing, and
   the host control apparatus comprising
   a controller configured to monitor an operation state of each of the plurality of substrate processing apparatuses, and, based on the operation state of the substrate processing apparatus determined by the determination unit to need the maintenance processing, control a timing of performance of the maintenance processing with respect to the substrate processing apparatus.

15. A substrate processing system having a plurality of substrate processing apparatuses operable to process a substrate, a host control apparatus operable to control operation of the plurality of substrate processing apparatuses, and a management apparatus operable to perform maintenance processing on each of the plurality of substrate processing apparatus,
   the management apparatus comprising:
   a determination unit configured to determine a substrate processing apparatus that needs maintenance processing, based on operation information collected from each of the plurality of substrate processing apparatuses; and
   a notification unit configured to notify, to the host control apparatus, information for executing the maintenance processing with respect to the substrate processing apparatus determined by the determination unit to need the maintenance processing, and
   the host control apparatus comprising:
   a controller configured to monitor an operation state of each of the plurality of substrate processing apparatuses, and, based on the operation state of the substrate processing apparatus determined by the determination unit to need the maintenance processing, control a timing of performance of the maintenance processing with respect to the substrate processing apparatus, and
   a transmission unit configured to transmit a request for the maintenance processing to the management apparatus at the controlled timing.

16. A substrate processing system having a plurality of substrate processing apparatuses operable to process a substrate, a host control apparatus operable to control operation of the plurality of substrate processing apparatuses, and a management apparatus operable to manage maintenance of each of the plurality of substrate processing apparatus,
   the management apparatus comprising:
   a detection unit configured to detect a substrate processing apparatus for which an abnormality or a sign of an abnormality is occurring, based on operation information collected from each of the plurality of substrate processing apparatuses; and
   a notification unit configured to notify a detection result and the operation information to the substrate processing apparatus for which the detection unit detected the occurrence of the abnormality or the sign,
   each of the plurality of substrate processing apparatuses comprising
   a transmission unit for, upon receiving the detection result and the operation information, transmitting the detection result and the operation information to the host control apparatus, and
   the host control apparatus comprising:
   a determination unit configured to determine, based on the detection result and the operation information, necessity of maintenance processing with respect to a first substrate processing apparatus which is a substrate processing apparatus that transmitted the detection result and the operation information, and
   a controller configured to monitor an operation state of each of the plurality of substrate processing apparatuses, and, if it is determined by the determination unit that the maintenance processing is necessary for the first substrate processing apparatus, control a timing of performance of the maintenance processing based on an operation state of the first substrate processing apparatus.

17. A substrate processing system having a plurality of substrate processing apparatuses operable to process a substrate, a host control apparatus operable to control operation of the plurality of substrate processing apparatuses, and a management apparatus operable to manage maintenance of each of the plurality of substrate processing apparatus,
   the management apparatus comprising:
   a detection unit configured to detect a substrate processing apparatus in which an abnormality or a sign of an abnormality is occurring, based on operation information collected from each of the plurality of substrate processing apparatuses; and
   a notification unit configured to notify a detection result and the operation information to the host control apparatus, without going through the substrate processing apparatus, and
   the host control apparatus comprising:
   a determination unit configured to identify, from the detection result, a first substrate processing apparatus which is a substrate processing apparatus for which the abnormality or the sign is detected by the detection unit, and determine, based on the detection result and the operation information, necessity of maintenance processing with respect to the first substrate processing apparatus, and a controller configured to monitor an operation state of each of the plurality of substrate processing apparatuses, and, if it is determined by the determination unit that the maintenance processing is necessary for the first substrate processing apparatus, control a timing of performance of the maintenance processing based on an operation state of the first substrate processing apparatus.

18. A method of controlling a substrate processing system having a plurality of substrate processing apparatuses operable to process a substrate, a host control apparatus operable to control operation of the plurality of substrate processing apparatuses, and a management apparatus operable to manage maintenance of each of the plurality of substrate processing apparatus, the method comprising:

the management apparatus determining a substrate processing apparatus that needs maintenance processing, based on operation information collected from each of the plurality of substrate processing apparatuses;

the management apparatus notifying a determination result to the substrate processing apparatus determined to need maintenance processing;

each of the plurality of substrate processing apparatuses transmitting information for executing the maintenance processing to the host control apparatuses upon receiving the determination result; and the host control apparatus monitoring an operation state of each of the plurality of substrate processing apparatuses, and, based on the operation state of the substrate processing apparatus that transmitted the information for executing the maintenance processing, controlling a timing of performance of the maintenance processing with respect to the substrate processing apparatus.

19. A computer-readable storage medium storing a computer program for causing a computer to execute each step of a method of controlling a substrate processing system according to claim 18.

20. A method of controlling a substrate processing system having a plurality of substrate processing apparatuses operable to process a substrate, a host control apparatus operable to control operation of the plurality of substrate processing apparatuses, and a management apparatus operable to manage maintenance of each of the plurality of substrate processing apparatus, the method comprising:

the management apparatus determining a substrate processing apparatus that needs maintenance processing, based on operation information collected from each of the plurality of substrate processing apparatuses;

the management apparatus notifying, to the host control apparatus, information for executing the maintenance processing with respect to the substrate processing apparatus determined to need the maintenance processing; and the host control apparatus monitoring an operation state of each of the plurality of substrate processing apparatuses, and, based on the operation state of the substrate processing apparatus determined to need the maintenance processing, controlling a timing of performance of the maintenance processing with respect to the substrate processing apparatus.

21. A method of controlling a substrate processing system having a plurality of substrate processing apparatuses operable to process a substrate, a host control apparatus operable to control operation of the plurality of substrate processing apparatuses, and a management apparatus operable to perform maintenance processing on each of the plurality of substrate processing apparatus, the method comprising:

the management apparatus determining a substrate processing apparatus that needs maintenance processing, based on operation information collected from each of the plurality of substrate processing apparatuses;

the management apparatus notifying, to the host control apparatus, information for executing the maintenance processing with respect to the substrate processing apparatus determined to need the maintenance processing; and the host control apparatus monitoring an operation state of each of the plurality of substrate processing apparatuses, and, based on the operation state of the substrate processing apparatus determined to need the maintenance processing, controlling a timing of performance of the maintenance processing with respect to the substrate processing apparatus; and the host control apparatus transmitting a request for the maintenance processing to the management apparatus at the controlled timing.

22. A method of controlling a substrate processing system having a plurality of substrate processing apparatuses operable to process a substrate, a host control apparatus operable to control operation of the plurality of substrate processing apparatuses, and a management apparatus operable to manage maintenance of each of the plurality of substrate processing apparatus, the method comprising:

the management apparatus detecting a substrate processing apparatus for which an abnormality or a sign of an abnormality is occurring, based on operation information collected from each of the plurality of substrate processing apparatuses;

the management apparatus notifying a detection result and the operation information to the substrate processing apparatus for which the occurrence of the abnormality or the sign is detected;

a substrate processing apparatus that received the detection result and the operation information transmitting the detection result and the operation information to the host control apparatus;

the host control apparatus determining, based on the detection result and the operation information, necessity of maintenance processing with respect to a first substrate processing apparatus which is the substrate processing apparatus that transmitted the detection result and the operation information; and the host control apparatus monitoring an operation state of each of the plurality of substrate processing apparatuses, and, if it is determined that the maintenance processing is necessary with respect to the first substrate processing apparatus, controlling a timing of performance of the maintenance processing based on an operation state of the first substrate processing apparatus.

23. A method of controlling a substrate processing system having a plurality of substrate processing apparatuses operable to process a substrate, a host control apparatus operable to control operation of the plurality of substrate processing apparatuses, and a management apparatus operable to manage maintenance of each of the plurality of substrate processing apparatus, the method comprising:

the management apparatus detecting a substrate processing apparatus for which an abnormality or a sign of an abnormality is occurring, based on operation information collected from each of the plurality of substrate processing apparatuses;

the management apparatus notifying a detection result and the operation information to the host control apparatus, without going through the substrate processing apparatus;

the host control apparatus identifying, from the detection result, a first substrate processing apparatus that is the substrate processing apparatus for which the abnormality or the sign is detected, and determining necessity of maintenance processing with respect to the first substrate processing apparatus based on the detection result and the operation information;

the host control apparatus monitoring an operation state of each of the plurality of substrate processing apparatuses, and, if it is determined that the maintenance processing is necessary with respect to the first substrate processing apparatus, controlling a timing of performance of the maintenance processing based on an operation state of the first substrate processing apparatus.

* * * * *